United States Patent [19]

Waggoner et al.

[11] Patent Number: 5,311,448
[45] Date of Patent: May 10, 1994

[54] PROGRAMMABLE LOAD BOARD WITH PROGRAMMABLE SIMULATION OF THERMAL DISSIPATION CHARACTERISTICS

[75] Inventors: Mark H. Waggoner, Bellville; Mark L. Hammons, Spring, both of Tex.

[73] Assignee: Compaq Computer Corporation, Houston, Tex.

[21] Appl. No.: 718,347

[22] Filed: Jun. 19, 1991

[51] Int. Cl.⁵ .............................................. G01R 21/10
[52] U.S. Cl. .................................... 364/578; 364/481; 364/579
[58] Field of Search ............... 364/578, 481, 483, 579, 364/806

[56] References Cited

U.S. PATENT DOCUMENTS

| | | | |
|---|---|---|---|
| 3,789,201 | 1/1974 | Carpenter et al. | 364/578 |
| 4,042,830 | 8/1977 | Kellenbenz et al. | 364/578 |
| 4,363,105 | 12/1982 | Plassmeier et al. | 364/579 |
| 4,635,259 | 1/1987 | Schinabeck et al. | 364/579 |
| 4,637,020 | 1/1987 | Schinbeck | 364/579 |
| 4,680,537 | 7/1987 | Miller | 324/500 |
| 4,686,627 | 8/1987 | Donovan et al. | 364/481 |
| 4,744,084 | 5/1988 | Beck et al. | 364/578 |
| 4,796,142 | 1/1989 | Libert | 364/483 |
| 5,101,149 | 3/1992 | Adams et al. | 324/73.1 |
| 5,111,459 | 5/1992 | DeVigne | 371/27 |

Primary Examiner—Kevin J. Teska
Assistant Examiner—Jae H. Choi
Attorney, Agent, or Firm—Pravel, Hewitt, Kimball & Krieger

[57] ABSTRACT

A programmable load board which can be used for testing the electrical load requirements and thermal response characteristics of electronic equipment. The programmable load board of the present invention is capable of emulating the maximum power at which the electronic component of the emulated system is rated. Both the power requirements and the location of the heat sources of the emulated system can be simulated. In the preferred embodiment of the invention, the programmable load board is constructed generally in the form of a circuit board such as that typically installed in a personal computer. The system is programmable, thus allowing a series of tests at differing loads to be conducted unattended for extended periods of time.

15 Claims, 5 Drawing Sheets

PROGRAMMABLE LOAD BOARD WITH PROGRAMMABLE SIMULATION OF THERMAL DISSIPATION CHARACTERISTICS

FIELD OF THE INVENTION

The present invention relates to systems for testing electronic equipment. More specifically, the present invention provides an improved means for testing the electrical load requirements and thermal response characteristics of electronic equipment.

BACKGROUND

It is well known that electronic components operating in high temperature environments are subject to performance degradation and even failure. Although the ambient environment can contribute to the thermal load of a device, the dominant thermal factor is typically the heat generated by the electronic components in the system.

Systems for testing the electrical load requirements and thermal response characteristics of electronic equipment are known in the art. Prior art systems used by engineering, design and manufacturing groups are typically comprised of banks of resistors which require physical connection and disconnection by means of soldering or jumpers to set the specified load. To reset the load in a prior art system using these resistive loads, it is necessary to disassemble the test unit, physically disconnect the resistive loads to change the power dissipation, and then reassemble the unit. This process must be repeated if the test system does not meet the desired specifications or if the testing requires data to be taken at several power levels. The inconvenience of disassembly and the inconsistent test results generated by these prior art systems makes them undesirable for repeated testing of a large volume of equipment.

It would be desirable to have a load board which is capable of testing the electrical load requirements and thermal response characteristics of electronic equipment without requiring disassembly and reassembly to change the testing parameters. It would further be desirable for a load board to be programmable to enable testing at various thermal levels while the board and system to be tested are left unattended for extended periods of time.

SUMMARY OF THE INVENTION

The present invention overcomes the difficulties of the prior art by providing a programmable load board (PLB) which can be used for testing the electrical load requirements and thermal response characteristics of electronic equipment. In its broadest embodiment, the PLB of the present invention is comprised of a plurality of thermal elements and means for selectively activating groups of these elements to simulate the power requirements and thermal dissipation characteristics of electronic components for an electronic device to be tested. In the preferred embodiment of the invention, the PLB can be programmed to change the test parameters while the system to be tested is operating.

The programmable load board of the present invention is capable of emulating the maximum power at which a central processing unit (CPU) of the emulated unit is rated. The PLB of the present invention further provides the ability to emulate both the power requirements and the location of the heat sources of a given option board. The PLB allows the heat source to be positioned at various locations to emulate the actual heat dissipation of a given component on a printed circuit board (PCB). The data obtained by the PLB of the present invention is standardized, thus allowing the results of tests performed by many individuals to be compared and analyzed.

The PLB of the present invention allows those conducting thermal tests of personal computers having Enhanced Industry Standard Architecture (EISA) or Industry Standard Architecture (ISA, based on the IBM Corp. PC/AT) busses to adjust the level of system power. In the preferred embodiment, the PLB of the present invention is constructed generally in the form of an ISA option board, such as that typically installed in a personal computer.

In a system which does not have a CPU, such as a prototype or a peripheral device, the PLB can operate in manual mode. When used in a system with a functioning CPU, simple commands can be used to change the load while the PLB is operating. When the load is controlled by the CPU, a series of tests at differing loads may be conducted unattended for extended periods of time. Using the PLB of the present invention, both the location and the dissipation of the load can be adjusted. Further, the system load can be adjusted while the system is unattended, thus allowing testing to continue for longer periods of time.

DETAILED DESCRIPTION OF THE PREFERRED EMBODIMENT

Figure 1:
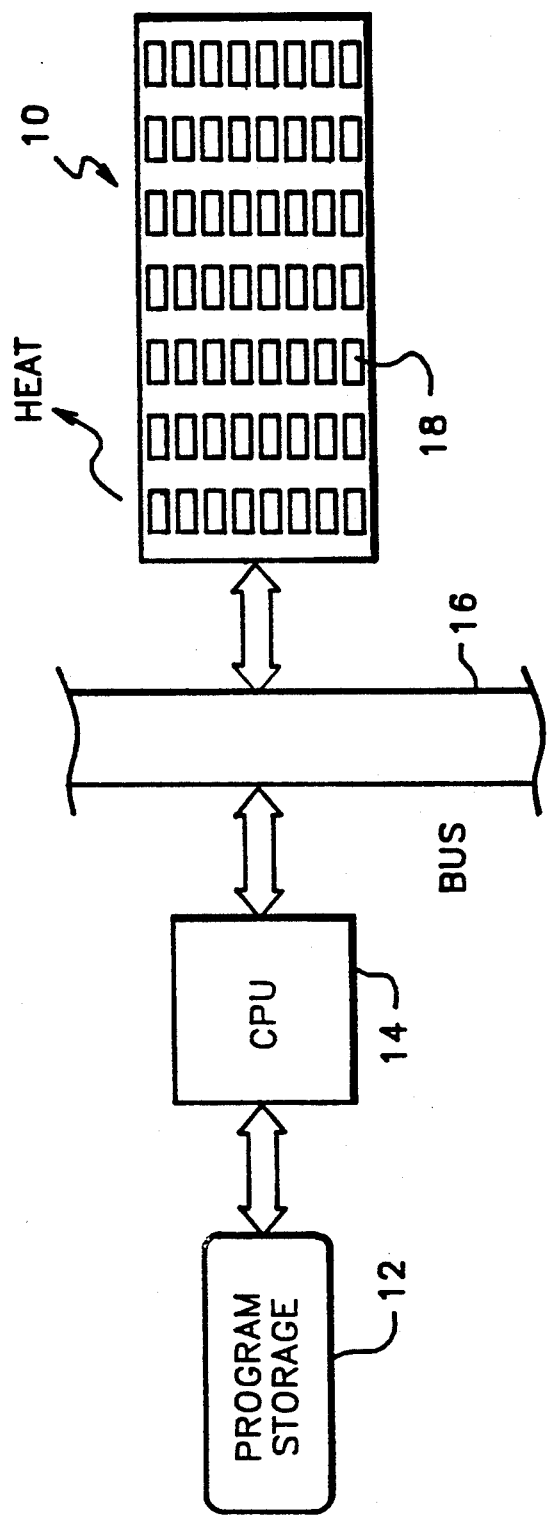
FIG. 1 is a block diagram depicting the programmable load board of the present invention in a system to be tested.

Referring now to FIG. 1, a block diagram is shown of a system for implementing the programmable load board (PLB) according to one embodiment of the present invention. The PLB 10 is controlled by an appropriate computer program stored in program storage 12. A central processing unit (CPU) 14 is responsive to the program and provides control and data signals to the PLB 10 via bus 16, which is generally connected to a plurality of expansion slots for receiving expansion circuit boards. A plurality of loads, illustrated generally by the reference numeral 18, are comprised of groups of load resistors and control circuitry discussed in greater detail below.

The PLB 10 is a programmable active/resistive load board capable of drawing the maximum allowable current specified for each supply voltage for a particular slot location within the system bus. Ideally, the load of the PLB 10 should not be purely resistive, and should be distributed around the board in a pattern to resemble an actual adaptor board.

In the preferred embodiment of the invention, the PLB operates in conjunction with an EISA bus. The specification for the maximum allowed current at each supply voltage for the EISA bus is shown below in Table 1.

TABLE 1

| Specified Maximum Current (EISA) | | |
| --- | --- | --- |
| Supply Voltage | # of Pins | Current |
| +5 V | 3 | 4.5 A |
| −5 V | 1 | 0.2 A |
| +12 V | 1 | 1.5 A |
| −12 V | 1 | 0.3 A |
| GND | 4 | 6.0 A |

In the preferred embodiment, the form factor of the PLB 10 is a standard ISA adapter card, with the maximum current per pin equal to 1.5 A.

Although the embodiment of the PLB discussed above is directed to an EISA bus configuration, the basic principles of operation of the PLB are not restricted to this particular architecture. The principles of the PLB can be used in boards designed for any bus architecture as well as emulators for processors, memory devices, or any other PCB that draws power. Furthermore, the PLB can be made to emulate any load required for peripheral devices (i.e. printers, storage devices, monitors, etc.)

Figure 2A:
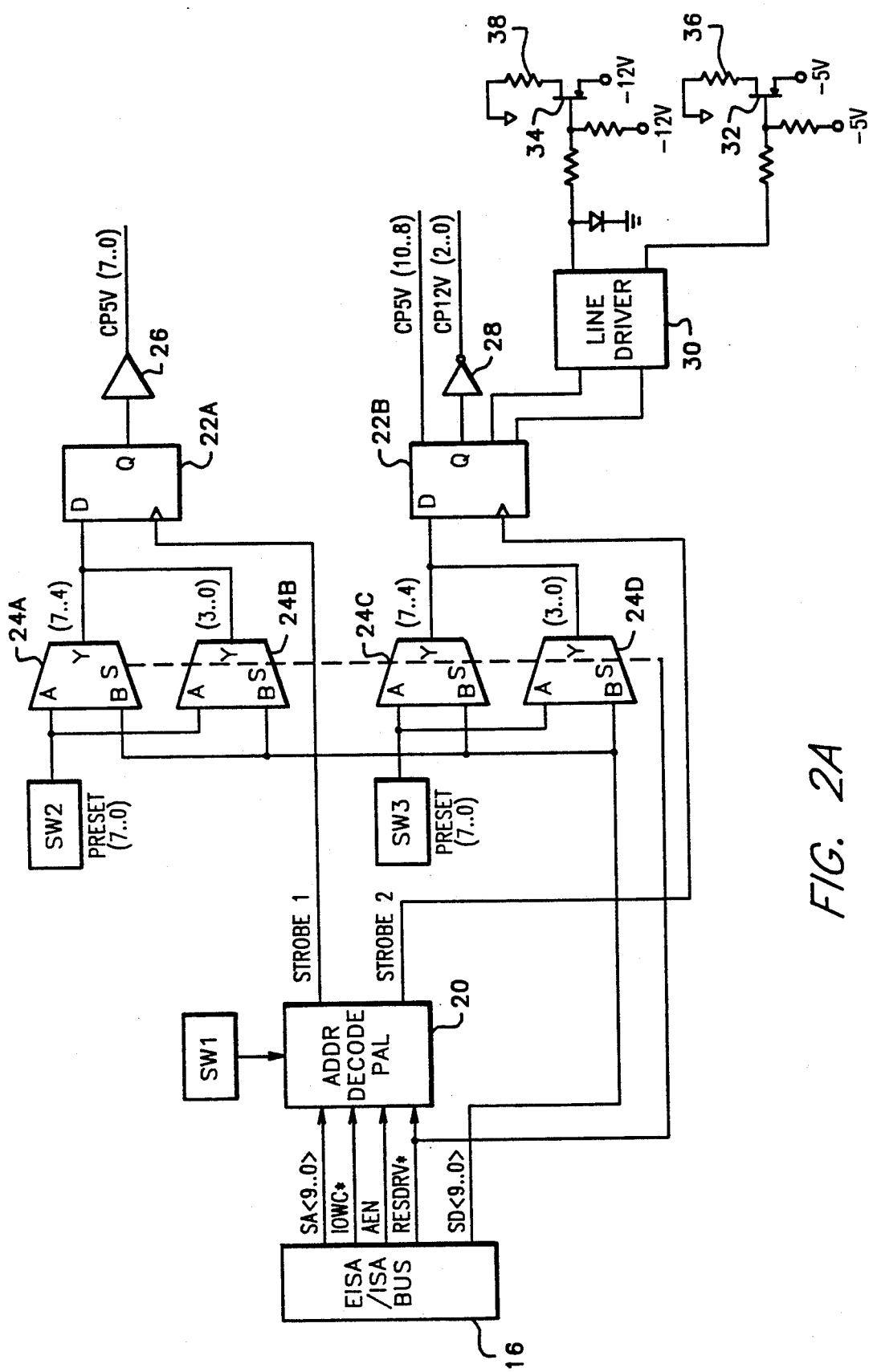
FIG. 2a is a schematic diagram of the control section of the programmable load board according to one embodiment of the present invention.

Referring now to FIG. 2a, a block diagram is shown of the control portion of the PLB. The control portion receives control signals from the bus 16, which in the preferred embodiment is an EISA bus. The lines carrying the control signals include the address enable signal AEN, address signals SA<9:0>, data signals SD<7:0>, input/output write strobe signal IOWC*, and the reset signal RESDRV*. The address signals, and the AEN, the RESDRV*, and the IOWC* signals from bus 16 serve as inputs to an address decode programmable array logic device (PAL) 20, which may be a 20L8 PAL. The address decode PAL 20 compares the I/O write address signals as qualified by the IOWC* and AEN signals with a base address as indicated by SW1. The address decode PAL 20 provides clock signals on address equality or system reset to control registers 22a and 22b in the form of 8-bit D-type flip-flops, which may be 74LS374 devices. The control registers 22a and 22b also receive their D inputs from a series of 2 line to 1 line data selectors/multiplexers 24a, 24b, 24c, and 24d which may be developed from 74157 data selectors, or the like. The multiplexers 24a and 24b receive one set of inputs from a switch SW2, which provides initial or reset values, and the other sets from data lines SD<7:0> for address matches, and provide outputs which serve as inputs to the control register 22a. The multiplexers 24c and 24d receive inputs from a switch SW3 and from data lines SD<7:0> to similarly provide reset and addressed value selection, and provide outputs which serve as inputs to the control register 22b. The multiplexers 24a, 24b, 24c, and 24d have the RESDRV* signal connected to the selection input so that during reset the switch SW2 and SW3 values are provided, while during normal operation the SD<7...0> lines provide the data values.

Control register 22a provides an output which serves as the input to octal buffer/line driver 26, which may be a 74S244 octal buffer and line driver. The octal buffer 26 provides 8 control bits for the +5 V supply voltage loads. Control register 22b provides an output which includes 3 control bits for the +5 V supply voltage loads and 3 control bits for the +12 supply voltage loads by means of a hex inverter 28, which may be a 74S04. Control register 22b also provides control bits for the −12 V and −5 V supply voltages. The −5 V and −12 V loads 36 and 38, respectively, are controlled by MOSFETS 32 and 34, respectively, which are controlled by a line driver 30, such as a 1488 RS232 buffer.

Figure 2B:
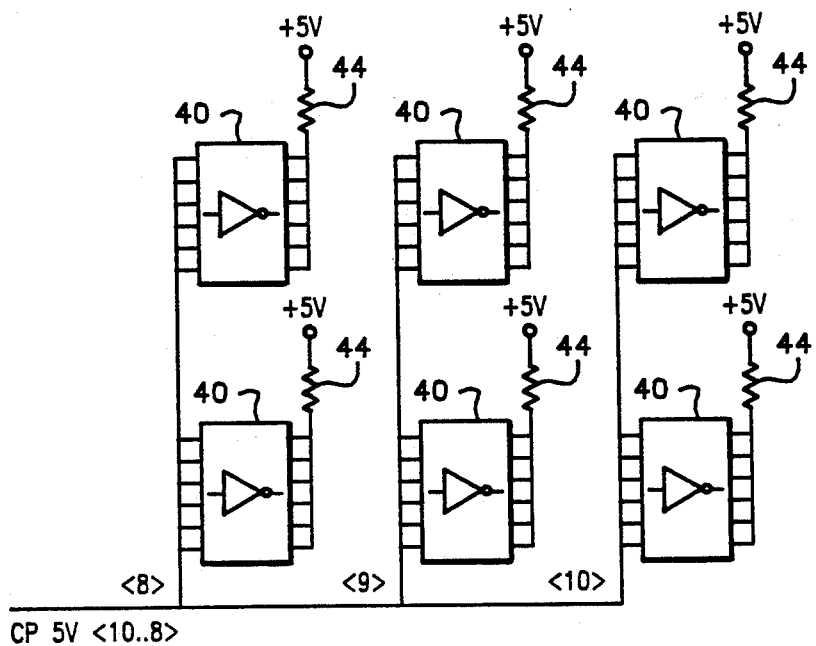
FIG. 2b is a schematic diagram of a first portion of the load section of the programmable load board according to one embodiment of the present invention.
Figure 2C:
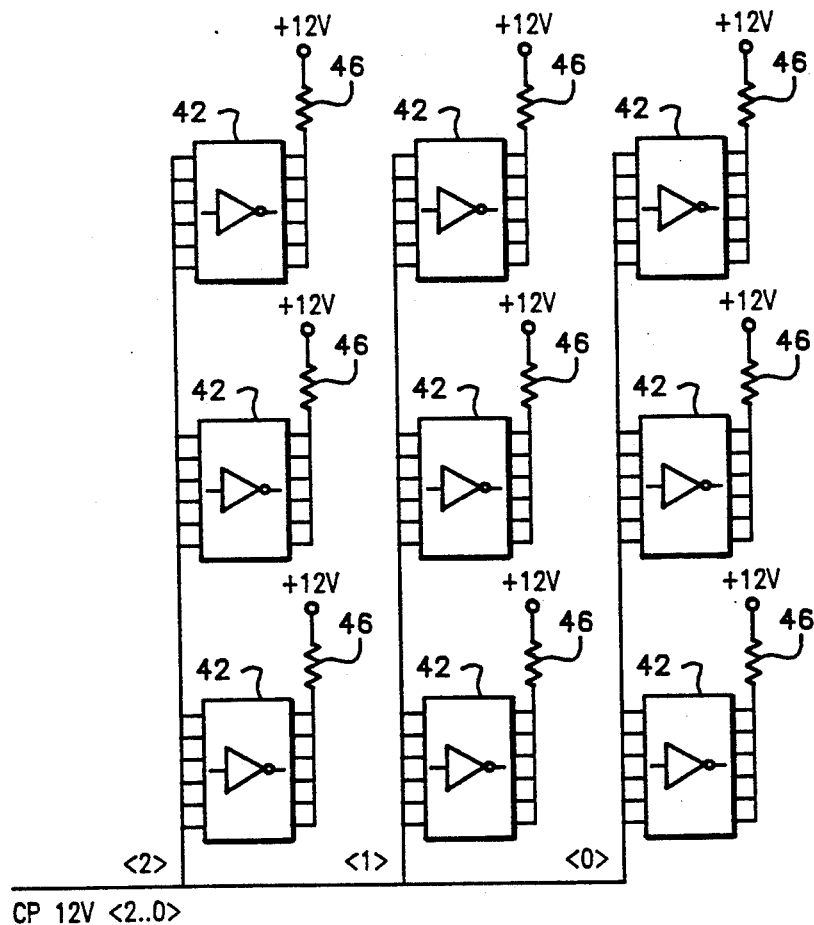
FIG. 2c is a schematic diagram of a second portion of the load section of the programmable load board according to one embodiment of the present invention.
Figure 2D:
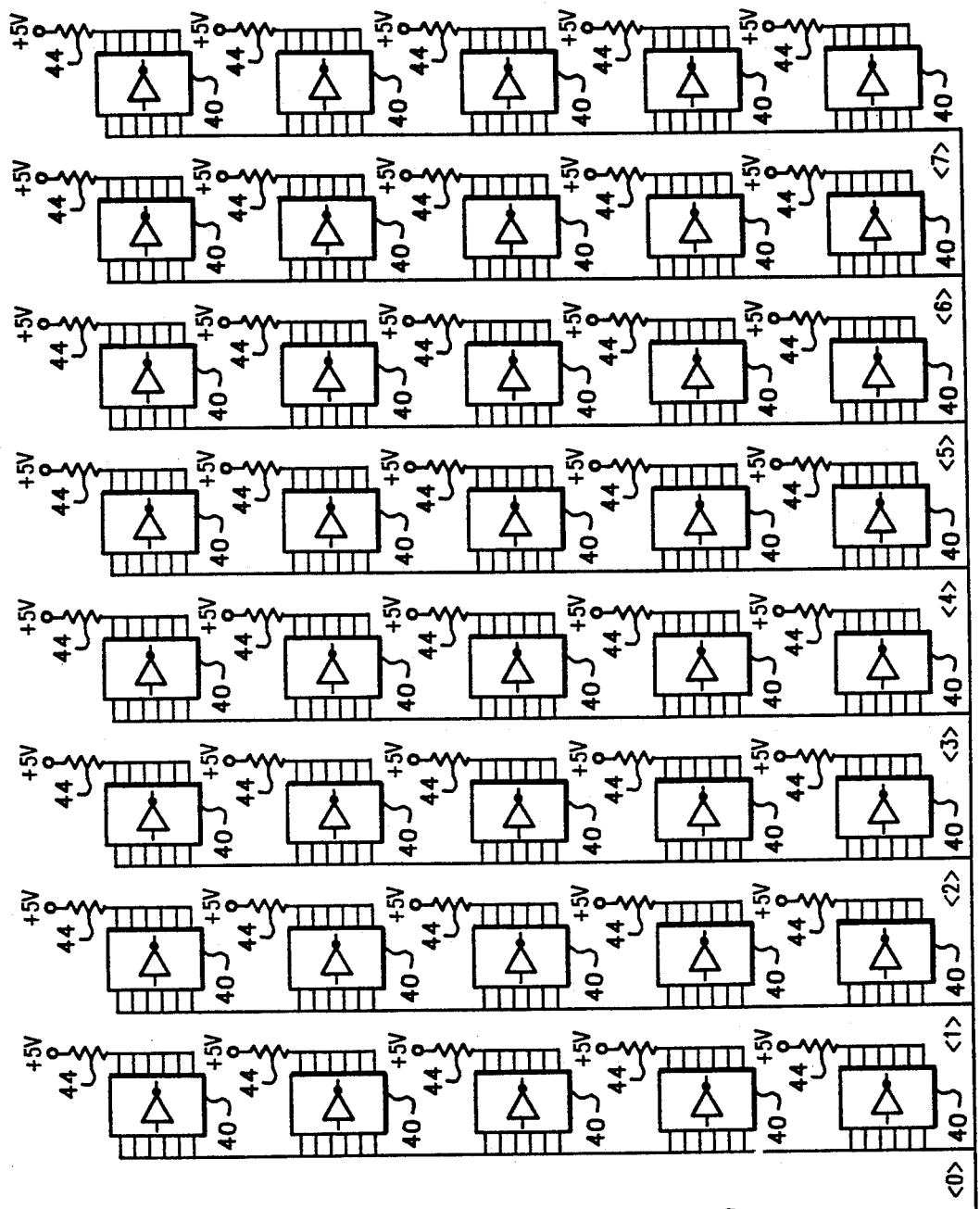
FIG. 2d is a schematic diagram of a third portion of the load section of the programmable load board according to one embodiment of the present invention.

Referring now to FIGS. 2b, 2c, and 2d, block diagrams are shown of the load portion of the PLB 10. The control signals shown in the control section of FIG. 2a, i.e., CP 5 V (10 ... 8), Cp 12 V (2 ... 0), and Cp 5 V (7 ... 0) are shown as inputs for the load sections of FIGS. 2b, 2c, and 2d, respectively.

The loads for the +5 V supply include 74S05 hex inverters 40 with open collector outputs to sink the load current of the +5 V supply voltage. Each 74S05 can sink up to 20 mA per buffer, providing a total of 120 mA per device. The +12 V loads include 7407 open collector hex buffer/drivers 42 with open collector high voltage outputs to sink the load current for the +12 V supply voltage. Each 7407 can sink up to 40 mA per buffer, providing a total sink capacity of 240 mA per device. Each inverter or buffer in a particular device is connected in parallel with all others in that device to an individual load resistor to allow load control, as will be described in more detail. Additional non-resistive load is provided by the actual load of the various buffers and inverters.

Each control line from the buffer 26 and the inverter 28 is connected to multiple loads which form load groups. For example, the bit 0 +5 V line, CP5V<0>, is connected to 5 parallel loads, as shown in FIG. 2d, that is, to all of the inputs of five 74S05 devices 40. Similarly, CP5V<7 ... 1> each are connected to 5 parallel loads. The control lines CP5V<10 ... 8> are lower power lines and each are connected to only two parallel loads, as shown in FIG. 2b. The CP12V<2 ... 0> control lines are each connected to three parallel +12 V loads consisting of 7407 devices and resistors 46, as shown in FIG. 2c. The power distribution for +5 V and +12 V cases is shown below in Table 2.

TABLE 2

| | Power distribution per device | | |
| --- | --- | --- | --- |
| Supply | IC | Resistor | Total |
| +5 V | 0.23 W | 0.77 W | 1.00 W |
| +12 V | 0.23 W | 2.03 W | 2.23 W |

The preferred minimum and maximum values for the resistive loads of the PLB are shown below in Table 3. The minimum load resistor is derived from the device maximum current rating with a 0.3 V drop across the active device. For example, the maximum load current for the 74S05 is 20 mA per buffer. This results in 120 mA (for 6 buffers), with a 4.7 V drop (5.0 V−0.3 V) across the load resistor, which yields a result of 4.7 V/120 mA, or 39.2 ohms. The maximum load resistance is derived from the maximum specified load current for a supply voltage and the number of loads available. For example, the maximum current rating for the +5 V supply is 4.5 A minus the 1.0 A no-load current, resulting in 3.5 A. There are 46 loads for the +5 V supply, which results in 3.5 A/46 or 76 mA per load. The voltage drop of 4.7 V divided by the current of 76 mA results in a maximum resistance of 62 ohms. Similar calculations for the other voltage and current ratings for the EISA bus result in the values shown below in Table 3.

TABLE 3

Minimum and Maximum Load Resistances

| Supply Voltage | Voltage Drop | Minimum Resistance | Maximum Resistance |
| --- | --- | --- | --- |
| +5 V | 0.3 V | 39 ohms | 62 ohms |
| +12 V | 0.3 V | 49 ohms | 70 ohms |
| −12 V | 0.12 V | 24 ohms | 40 ohms |
| −5 V | 0.1 V | 10 ohms | 25 ohms |

Load values exceeding the maximum theoretical resistance listed above may prevent the PLB from drawing the maximum permissible current, but may be acceptable for certain applications. Load values lower than the theoretical minimum, however, may result in excess current being drawn, which could result in damage to the PLB. In practice, it has been determined that the values shown above are suitable to allow sufficient localization of heat and to optimize the amount of current being drawn.

FIG. 2b is a schematic illustration of a first portion of the load section of the PLB comprising three +5 V load groups, each of which is capable of drawing 0.24 A. Each of the individual loads in the load groups comprises a 74S05, illustrated by reference numeral 40, and a load resistor 44, which has a value of 47 ohms in the preferred embodiment.

FIG. 2c is an illustration of a second portion of the load section of the PLB comprising three +12 V load groups, each of which is capable of drawing 0.72 A. Each of the individual loads comprises a 7407, illustrated by reference numeral 42, and a load resistor 46, which has a value of 90 ohms in the preferred embodiment. This value, which is higher than the theoretical maximum, results in a slightly lower current draw than is theoretically possible, but still provides excellent results. The 90 ohm resistance can be achieved by placing two 180 ohm resistors in parallel, as shown in the preferred embodiment of the +12 V loads illustrated on the PLB of FIG. 3.

FIG. 2d is an illustration of a third portion of the load section of the PLB comprising eight +5 V loads, each of which is capable of drawing 0.60 A. As discussed above in connection with the loads shown in FIG. 2b, each of the individual load devices comprises a 74S05, illustrated by reference numeral 40, and a load resistor 44, which has a value of 47 ohms in the preferred embodiment.

The PLB 10 powers up in a preset load condition which is switch selectable using SW2 and SW3, shown in FIG. 2a. The two control registers 22a and 22b can be coupled to the bus 16 through suitable buffers (not shown) to allow the actual load setting values to be read to determine whether the initial value or written value was correctly loaded, and whether the board is operating correctly.

To activate a particular load group, the CPU 10 writes specific values to the control registers 22a and 22b. The CPU 10 must write a 1 to turn on a load group, and a 0 to turn off a load group. The SW2 and SW3 reset settings and the relations of control registers 22a and 22b to the load groups are shown below in Table 4.

TABLE 4

Switch Description

| Switch | Pos | S/W Bit (Base + 1) | Signal | Voltage | Load # | Load |
| --- | --- | --- | --- | --- | --- | --- |
| SW3 | 1 | 7 | CP5V<7> | +5 | 7 | 0.60 A |
|  | 2 | 6 | CP5V<6> | +5 | 6 | 0.60 A |
|  | 3 | 5 | CP5V<5> | +5 | 5 | 0.60 A |
|  | 4 | 4 | CP5V<4> | +5 | 4 | 0.60 A |
|  | 5 | 3 | CP5V<3> | +5 | 3 | 0.60 A |
|  | 6 | 2 | CP5V<2> | +5 | 2 | 0.60 A |
|  | 7 | 1 | CP5V<1> | +5 | 1 | 0.60 A |
|  | 8 | 0 | CP5V<0> | +5 | 0 | 0.60 A |
| Switch | Pos | S/W Bit (Base + 0) | Signal | Voltage | Load # | Load |
| SW2 | 1 | 7 | CP5V<10> | +5 | 10 | 0.24 A |
|  | 2 | 6 | CP5V<9> | +5 | 9 | 0.24 A |
|  | 3 | 5 | CP5V<8> | +5 | 8 | 0.24 A |
|  | 4 | 4 | CP12V<2> | +12 | 2 | 0.72 A |
|  | 5 | 3 | CP12V<1> | +12 | 1 | 0.72 A |
|  | 6 | 2 | CP12V<0> | +12 | 0 | 0.72 A |
|  | 7 | 1 | — | −12 | — | 0.29 A |
|  | 8 | 0 | — | −5 | — | 0.25 A |

Note:
Switch = off: the value is 1 (or load is on)
Switch = on: the value is 0 (or load is off)

Because the various integrated circuit devices are powered at all times, even when the programmable resistive loads are disabled, certain minimum currents are required as shown below in Table 5. To calculate the total load for any supply this "no-load" value is added to the number of loads turned on.

TABLE 5

No-Load Values

| Supply Voltage | No-Load Value |
| --- | --- |
| +5 V | 0.98 A |
| +12 V | 0.02 A |
| −12 V | 0.02 A |
| −5 V | 0.00 A |

Figure 3:
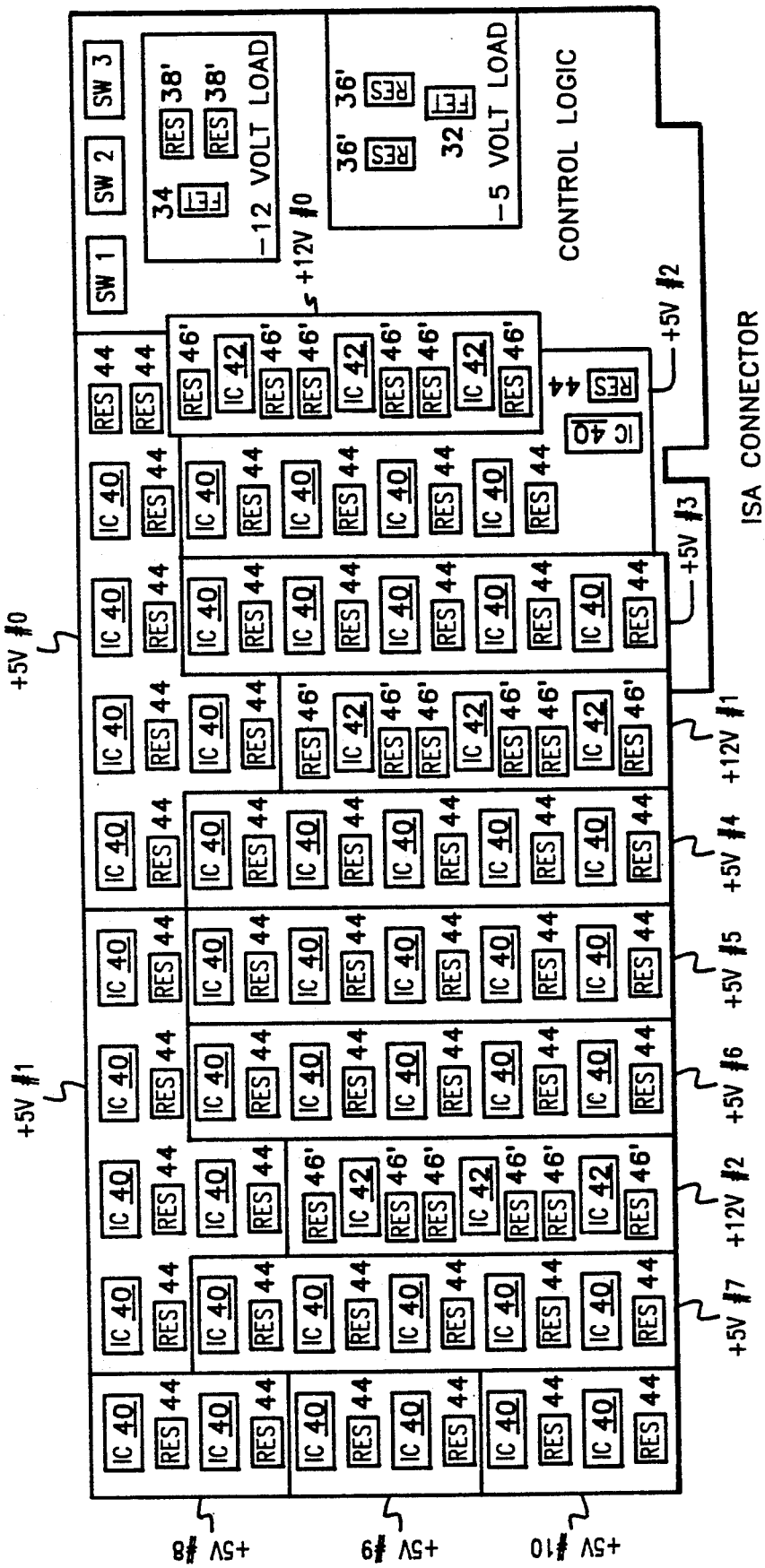
FIG. 3 is a block diagram of the programmable load board according to one embodiment of the present invention showing various groupings of load elements.

Referring now to FIG. 3, the arrangements of the loads on the preferred embodiment of the PLB 10 are shown. The loads are arranged into groups to enable the PLB 10 to emulate the location of a thermal source, as well as its power dissipation. In the embodiment shown in FIG. 3, a total of sixteen programmable load groups are illustrated; however, it is apparent to those skilled in the art that there are numerous variations possible for the arrangement of the load groups. Of the sixteen load groups shown, a total of eleven are +5 V load groups and three are +12 V load groups. Of the loads shown in FIG. 3, +5 V load groups #8, #9, and #10 correspond to the load groups shown in FIG. 2b; +12 V load groups #0, #1, and #2 correspond to the load groups shown in FIG. 2c; and +5 V load groups #0 though #7 correspond to the loads shown in FIG. 2d.

In addition to the +5 V and +12 V load groups, there is a single −5 V load and a single −12 V load. The load resistance 36 for the −5 V load is provided by two 39 ohm resistors in parallel, each of which is illustrated by reference numeral 36' in FIG. 3. The load resistance 38 for the −12 V load is provided by two 82 ohm resistors in parallel, each of which is illustrated by reference numeral 38'.

By selecting combinations of the load groups shown in FIG. 3, it is possible to simulate the operating characteristics of a wide range of electronic components. For example, the PLB of the present invention is capable of emulating the maximum power at which a central processing unit (CPU) of the emulated unit is rated. The PLB further provides the ability to emulate both the power requirements and the location of the heat sources of a given option board. The PLB allows the heat source to be positioned at various locations to emulate the actual heat dissipation of a given component on a printed circuit board. The data obtained by the PLB of the present invention is standardized, thus allowing the results of tests performed by many individuals to be compared and analyzed.

The programmable load board of the present invention allows those conducting thermal tests of personal computers having EISA or ISA busses to adjust the level of system power. In a system which does not have a CPU, such as a prototype or a peripheral device, the PLB can operate in manual mode by setting reset values in switches SW2 and SW3. When used in a system with a functioning CPU, simple I/O commands can be used to change the load while the PLB is operating by writing to the control registers 22a and 22b. When the load is controlled by the CPU, a series of tests at differing loads may be conducted unattended for extended periods of time. Using the PLB of the present invention, both the location and the dissipation of the load can be adjusted. Further, because the PLB of the present invention is programmable, the system load can be adjusted while the system is unattended, thus allowing testing to continue for longer periods of time. This is particularly desirable when coupled with automated temperature monitoring equipment to allow a full battery of tests to be performed unattended and automatically.

Although the present invention has been described in connection with the preferred embodiment, it is not intended to be limited to the specific form set forth herein, but on the contrary, it is intended to cover such modifications, alternatives, and equivalents as can be reasonably included within the spirit and scope of the invention as defined by the appended claims.

We claim:

1. A system for simulating electrical performance characteristics of electronic components at various locations on a printed circuit board comprising:
   a plurality of electrical loads, said electrical loads being arranged in a plurality of groups at various locations on said printed circuit board, each of said load groups producing a predetermined quantity of electrical load; and
   programmable means for selectively activating said load groups to simulate the electrical performance characteristics of electronic components on said printed circuit board.

2. The system of claim 1, wherein said load groups produce a thermal output to simulate thermal dissipation by electronic components on said printed circuit board.

3. The system of claim 1, wherein said load groups are placed at predetermined locations on said printed circuit board to simulate the electrical load and thermal dissipation characteristics of electronic circuit components on said printed circuit board.

4. The system of claim 1, said plurality of electrical loads comprising a plurality of resistive loads connected to a power source.

5. The system of claim 4, said plurality of electrical loads further comprising active devices forming an electrical load and further controlling the operation of said resistive loads.

6. The system of claim 1, said programmable means for selectively activating said load groups comprising logic control circuitry for addressing individual load groups.

7. The system according to claim 6, said logic control circuitry comprising a central processing unit responsive to a stored computer program.

8. A system for simulating electrical and thermal characteristics of electronic components on a printed circuit board, comprising:
   an electronic circuit board comprising a control portion and a load portion, said load portion comprising a plurality of electrical loads arranged in load groups at predetermined locations on said electronic circuit board, said control portion comprising programmable means for selectively activating said load groups to simulate the electrical and thermal load characteristics of electronic components on said electronic circuit board.

9. The system of claim 8, said programmable means for selectively activating said load groups comprising logic control circuitry for addressing individual load groups.

10. The system of claim 8, wherein said load groups are placed at predetermined locations on said printed circuit board to simulate the electrical load and thermal dissipation characteristics of electronic components operating at said predetermined locations on said printed circuit board.

11. The system of claim 8, said plurality of electrical loads comprising a plurality of resistive loads.

12. The system of claim 11, said plurality of electrical loads further comprising active devices forming an electrical load and further controlling the operation of said resistive loads.

13. A programmable load board for simulating thermal dissipation characteristics of an electronic circuit board, comprising:
   a plurality of electrical loads arranged in a plurality of load groups on said load board, each of said load groups producing heat when activated; and
   programmable means for selectively activating said load groups to simulate the thermal dissipation characteristics of the electronic circuit board.

14. The programmable load board of claim 13, wherein:
   said load groups are positioned at different locations on said load board to simulate components at various locations thereon; and
   said programmable means comprises means selectively adjusting said load groups being activated to simulate thermal dissipation of a component at a given location on said load board.

15. A programmable load board for simulating electrical load and thermal dissipation characteristics of an electronic circuit board, comprising:
   a plurality of electrical loads arranged in a plurality of load groups on said board, each of said load groups producing a predetermined quantity of electrical load and heat; and
   programmable means for selectively activating said load groups to simulate the electrical load and thermal dissipation characteristics of the electronic circuit board.

* * * * *